United States Patent [19]

Yokota et al.

[11] Patent Number: 4,937,755
[45] Date of Patent: Jun. 26, 1990

[54] PRODUCTION SYSTEM FOR AN EXPERT SYSTEM

[75] Inventors: Takayoshi Yokota; Keisuke Bekki, both of Hitachi; Nobuhiro Hamada, Hitachioota, all of Japan

[73] Assignee: Hitachi, Ltd., Tokyo, Japan

[21] Appl. No.: 187,590

[22] Filed: Apr. 28, 1988

[30] Foreign Application Priority Data

May 6, 1987 [JP] Japan .................. 62-109046

[51] Int. Cl.$^5$ ............................. G06F 15/60
[52] U.S. Cl. ................... 364/488; 364/513; 364/468
[58] Field of Search ............... 364/488–491, 364/513, 300, 468, 200, 900

[56] References Cited

U.S. PATENT DOCUMENTS

| | | | |
|---|---|---|---|
| 4,145,735 | 3/1979 | Soga | 364/200 |
| 4,635,208 | 1/1987 | Coleby et al. | 364/491 |
| 4,649,515 | 3/1987 | Thompson et al. | 364/900 |
| 4,651,284 | 3/1987 | Watanabe et al. | 364/491 |
| 4,670,848 | 6/1987 | Schramm | 364/200 |
| 4,700,317 | 10/1987 | Watanabe et al. | 364/488 |
| 4,703,435 | 10/1987 | Darringer et al. | 364/489 |
| 4,748,439 | 5/1988 | Robinson et al. | 364/900 |

FOREIGN PATENT DOCUMENTS

| | | |
|---|---|---|
| 0199304 | 10/1986 | European Pat. Off. . |
| 24646 | 2/1985 | Japan . |
| 109148 | 5/1986 | Japan . |

OTHER PUBLICATIONS

"A Rule-Based System for Optimizing Combinational Logic", by A. J. deGeus and W. Cohen, IEEE Design & Test, 1985, pp. 22–32.

Primary Examiner—Parshotam S. Lall
Assistant Examiner—V. N. Trans
Attorney, Agent, or Firm—Antonelli, Terry & Wands

[57] ABSTRACT

A production system for an expert system comprising: a production rule memory unit storing circuit conversion rules, each having a condition part describing circuit connection and an execution part describing a conversion of the condition part to an equivalent logic circuit dependent upon a predetermined semiconductor technology and further having a provisionally predetermined priority; a task data memory unit storing circuit connection data, each being subjected to an application of the circuit conversion rules; a production rule interpretation and execution unit for selecting a circuit conversion rule in accordance with the provisionally predetermined priority, collating the condition part of the selected circuit conversion rule with the circuit connection data to determine whether the condition part matches with a part of the circuit connection data and, when the both match each other, converting the part of the circuit connection data by the corresponding execution part of the circuit conversion rule to an equivalent logic circuit; further each production rule being provided with a rule flag indicating the collation failure to the circuit connection data, a rule flag memory unit for setting the rule, flag of the circuit conversion rule of which condition part did not match with any of the circuit connection data during the collation cycle, so as to inhibit collation thereafter until collation of all other circuit conversion rules is once completed, thereby increasing the operation speed of the production system for an expert system.

9 Claims, 15 Drawing Sheets

```
wm(and, [2] ,102),
wm(and, [1,1002] ,2001),
wm(and, [1000,1001,2] ,2002),
wm(and, [1000,1001,1002] ,2003),
wm(and, [0,2] ,2004),
wm(or, [2001,2002] ,101),
wm(or, [2003,2004] ,100),
wm(inv,2,1002),
wm(inv,1,1001),
wm(inv,0,1000).
```

FIG. 5(a)

```
rule(5, if,    [[and,In1,Out1],
                [and,In2,Out2],
                [not_match,In1,In2],
                [intersect,In1,In2,Ans],
                [num_of_atom,Ans,N],
                [not_match,N,0],
                [not_match,N,1]],
         then, [kill(wm(and,In1,Out1)),
                kill(wm(and,In2,Out2)),
                delete_list(Ans,In1,In1new),
                delete_list(Ans,In2,In2new),
                global_node_num(NN),
                NNN is NN+1,
                assert(wm(and,Ans,NNN)),
                append([NNN],In1new,Newin1),
                append([NNN],In2new,Newin2),
                assert(wm(and,Newin1,Out1)),
                assert(wm(and,Newin2,Out2)),
                retract(global_node_num(NN)),
                assert(global_node_num(NNN))]).
```

FIG. 5(b)

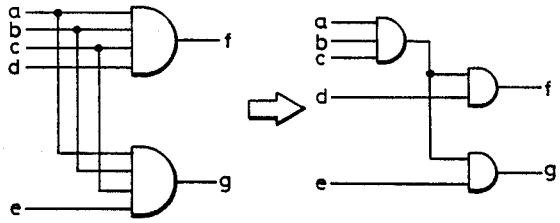

FIG. 5(c)

```
rule(9, if,    [[nor_and,ins1,List1,ins2,List2,ins3,[],out,Out1],
                [and,In,Out2],
                [match,[Out2],List2],
                [check_not_con_others,Out2 [nor_and,ins1,List1,ins2,List2,
                    ins3,[],out,Out1]]],
         then, [kill(wm(nor_and,ins1,List1,ins2,List2,ins3,[],out,Out1)),
                kill(wm(and,In,Out2)),
                assert(wm(nrW,and_in,List1,and_in,In,in2,[],out,Out1))]).
```

FIG. 5(d)

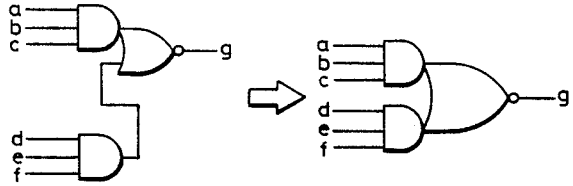

FIG. 5(e)

```
rule(11, if,   [[and,[Y1,Y2],Out],
                [inv,X1,Y1],
                [inv,X2,Y2],
                [check_not_con_others,Y1,[and,[Y1,Y2,Out]]],
                [check_not_con_others,Y2,[and,[Y1,Y2,Out]]]],
         then, [kill(wm(and,[Y1,Y2],Out)),
                assert(wm(nor,[X1,X2],Out))]).
```

FIG. 5(f)

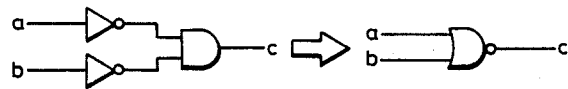

FIG. 5(g)

```
rule(17, if,   [[and,In,Out],
                [or,Input,Out2],
                [member,Out,Input],
                [check_not_con_others,Out,[or,Input,Out2]]],
         then, [kill(wm(and,In,Out)),
                kill(wm(or,Input,Out2)),
                global_node_num(N),
                Outn is N+1,
                retract(global_node_num(N)),
                assert(global_node_num(Outn)),
                delete(Out,Input,Input2),
                assert(wm(nor_and,and_in,In,inputs,Input2,in2,[],out,Outn)),
                assert(wm(inv,Outn,Out2))]).
```

FIG. 5(h)

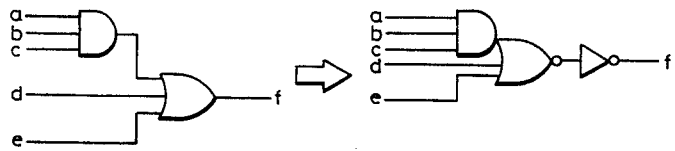

```
wm(inv,2,1002),
wm(inv,1,1001),
wm(inv,0,1000),
wm(nor, [1,0] ,5001),
wm(connect,2,102),
wm(nrW,and_in, [0,2] ,and_in, [5001,1002] ,inputs, [] ,out,5008),
wm(nrW,and_in, [1,1002] ,and,in, [5001,2] ,inputs, [] ,out,5007).
```

```
cycle(1,5),
cycle(2,11),
cycle(3,17),
cycle(4,17),
cycle(5,_),
cycle(6,9),
cycle(7,9),
cycle(8,_),
cycle(9,_).
```

FIG. 9(a)

| COLLATION CYCLE | RULE NUMBER | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 |
| #1 | x | x | x | x | o | | | | | | | | | | | | | | | |
| #2 | | | | | x | x | x | x | x | x | o | | | | | | | | | |
| #3 | | | | | | | | | | | x | x | x | x | x | x | o | | | |
| #4 | | | | | | | | | | | | | | | | | o | | | |
| #5 | | | | | | | | | | | | | | | | | x | x | x | x |
| #6 | x | x | x | x | x | x | x | x | o | | | | | | | | | | | |
| #7 | | | | | | | | | o | | | | | | | | | | | |
| #8 | | | | | | | | | x | x | x | x | x | x | x | x | x | x | x | x |
| #9 | x | x | x | x | x | x | x | x | | | | | | | | | | | | |

FIG. 9(b)

| COLLATION CYCLE | RULE NUMBER | | | | | | | | | | | | | | | | | | | |
|---|---|---|---|---|---|---|---|---|---|---|---|---|---|---|---|---|---|---|---|---|
| | 1 | 2 | 3 | 4 | 5 | 6 | 7 | 8 | 10 | 11 | 12 | 13 | 14 | 15 | 16 | 17 | 9 | 18 | 19 | 20 |
| #1 | x | x | x | x | o | | | | | | | | | | | | | | | |
| #2 | | | | | x | x | x | x | x | o | | | | | | | | | | |
| #3 | | | | | | | | | x | x | x | x | x | x | o | | | | | |
| #4 | | | | | | | | | | | | | | | | o | | | | |
| #5 | | | | | | | | | | | | | | | | x | o | | | |
| #6 | | | | | | | | | | | | | | | | | o | | | |
| #7 | | | | | | | | | | | | | | | | | x | x | x | x |
| #8 | x | x | x | x | x | x | x | x | x | x | x | x | x | x | x | x | o | | | |

FIG. 9(c)

| COLLATION CYCLE | RULE NUMBER | | | | | | | | | | | | | | | | | | | |
|---|---|---|---|---|---|---|---|---|---|---|---|---|---|---|---|---|---|---|---|---|
| | 5 | 11 | 17 | 9 | 1 | 2 | 3 | 4 | 6 | 7 | 8 | 10 | 12 | 13 | 14 | 15 | 16 | 18 | 19 | 20 |
| #1 | o | | | | | | | | | | | | | | | | | | | |
| #2 | x | o | | | | | | | | | | | | | | | | | | |
| #3 | | x | o | | | | | | | | | | | | | | | | | |
| #4 | | | o | | | | | | | | | | | | | | | | | |
| #5 | | x | o | | | | | | | | | | | | | | | | | |
| #6 | | | o | | | | | | | | | | | | | | | | | |
| #7 | | | x | x | x | x | x | x | x | x | x | x | x | x | x | x | x | x | x | x |
| #8 | x | x | x | | | | | | | | | | | | | | | | | |

FIG. 15(a)

| COLLATION CYCLE | RULE NUMBER |  |  |  |  |  |  |  |  |  |  |  |  |  |  |  |  |  |  |  |
|---|---|---|---|---|---|---|---|---|---|---|---|---|---|---|---|---|---|---|---|---|
|  | 1 | 2 | 3 | 4 | 5 | 6 | 7 | 8 | 9 | 10 | 11 | 12 | 13 | 14 | 15 | 16 | 17 | 18 | 19 | 20 |
| #1 | x | x | x | x | o |  |  |  |  |  |  |  |  |  |  |  |  |  |  |  |
| #2 | x | x | x | x | x | x | x | x | x | x | o |  |  |  |  |  |  |  |  |  |
| #3 | x | x | x | x | x | x | x | x | x | x | x | x | x | x | x | x | o |  |  |  |
| #4 | x | x | x | x | x | x | x | x | x | x | x | x | x | x | x | x | o |  |  |  |
| #5 | x | x | x | x | x | x | x | x | o |  |  |  |  |  |  |  |  |  |  |  |
| #6 | x | x | x | x | x | x | x | x | o |  |  |  |  |  |  |  |  |  |  |  |
| #7 | x | x | x | x | x | x | x | x | x | x | x | x | x | x | x | x | x | x | x | x |

FIG. 15(b)

| COLLATION CYCLE | RULE NUMBER |  |  |  |  |  |  |  |  |  |  |  |  |  |  |  |  |  |  |  |
|---|---|---|---|---|---|---|---|---|---|---|---|---|---|---|---|---|---|---|---|---|
|  | 1 | 2 | 3 | 4 | 5 | 6 | 7 | 8 | 10 | 11 | 12 | 13 | 14 | 15 | 16 | 17 | <u>9</u> | 18 | 19 | 20 |
| #1 | x | x | x | x | o |  |  |  |  |  |  |  |  |  |  |  |  |  |  |  |
| #2 | x | x | x | x | x | x | x | x | x | o |  |  |  |  |  |  |  |  |  |  |
| #3 | x | x | x | x | x | x | x | x | x | x | x | x | x | x | o |  |  |  |  |  |
| #4 | x | x | x | x | x | x | x | x | x | x | x | x | x | x | o |  |  |  |  |  |
| #5 | x | x | x | x | x | x | x | x | x | x | x | x | x | x | x | o |  |  |  |  |
| #6 | x | x | x | x | x | x | x | x | x | x | x | x | x | x | x | o |  |  |  |  |
| #7 | x | x | x | x | x | x | x | x | x | x | x | x | x | x | x | x | x | x | x | x |

FIG. 15(c)

| COLLATION CYCLE | RULE NUMBER |  |  |  |  |  |  |  |  |  |  |  |  |  |  |  |  |  |  |  |
|---|---|---|---|---|---|---|---|---|---|---|---|---|---|---|---|---|---|---|---|---|
|  | <u>5</u> | <u>11</u> | <u>17</u> | 9 | 1 | 2 | 3 | 4 | 6 | 7 | 8 | 10 | 12 | 13 | 14 | 15 | 16 | 18 | 19 | 20 |
| #1 | o |  |  |  |  |  |  |  |  |  |  |  |  |  |  |  |  |  |  |  |
| #2 | x | o |  |  |  |  |  |  |  |  |  |  |  |  |  |  |  |  |  |  |
| #3 | x | x | o |  |  |  |  |  |  |  |  |  |  |  |  |  |  |  |  |  |
| #4 | x | x | o |  |  |  |  |  |  |  |  |  |  |  |  |  |  |  |  |  |
| #5 | x | x | x | o |  |  |  |  |  |  |  |  |  |  |  |  |  |  |  |  |
| #6 | x | x | x | o |  |  |  |  |  |  |  |  |  |  |  |  |  |  |  |  |
| #7 | x | x | x | x | x | x | x | x | x | x | x | x | x | x | x | x | x | x | x | x |

PRODUCTION SYSTEM FOR AN EXPERT SYSTEM

BACKGROUND OF INVENTION

The present invention relates to a production system or a rule based system for an expert system which employs a look-ahead inference type program and transforms existing implementations from one technology to another. In particular the present invention is suitable for automatic designing of a combinational logic circuit used in a large scale logic apparatus such as CMOS-LSI, LSI in a logic circuit design support system using a computer.

Technology for increasing the speed of a production system proposed so far lies on an extension of a rule compiler system which is based upon a discrimination net. With the algorithm of this type, the efficiency decreases drastically in a field of applications where conditions of production rules contain many variables, and the compiling time is extended, too. Moreover, the processing system itself becomes complex. In particular in a field which deals with circuit connection data such as of an equivalent conversion of logic circuit, the production rules inevitably contain increased number of variables. It is therefore necessary to realize a production system which is capable of operating at high speeds even in such a field of applications.

Examples of prior art disclosing a production system for an expert system are ; JP-A-61-109148 laid open on May 27, 1986, JP-A-60-24646 laid open on Feb. 7, 1985, JP-A-61-88371 laid open on May 6, 1986 which corresponds to U.S. Pat. No. 4,703,435 issued on Oct. 27, 1987, EP-A-0 199 304 laid open on Oct. 29, 1986 and Aart J. de Geus and William Cohen "A Rule-Based System for Optimizing Combinational Logic" (IEEE DESIGN & TEST, August 1985, PP 22-32).

In the aforementioned prior art, no attention has been given in regard to increasing the operation speed of the production system and, particularly, in regard to handling the substantially homogeneous data, such as logic circuit connection data. Therefore, the processing speed decreases when there are contained many variables in the respective condition parts of the production rules. Therefore, the production system spends extended periods of time for collating a tremendous number of production rules that are applicable, as the scale of the circuit to be converted and the number of rules increase.

SUMMARY OF THE INVENTION

One object of the present invention is to provide a production system for an expert system treating homogeneous and great number of fact information with decreased production rule collation time through skipping collations.

Another object of the present invention is to increase the operation speed of a production system for an expert system which handles homogeneous data such as circuit connection data by limiting the application of production rules though an actual application experience and by rearranging the order of production rules though the learned experience, instead of taking advantage of the foreseeing data included in the production rules themselves that are used in the existing rule compilers.

One aspect of the production system for an expert system according to the present invention is to provide each of production rules stored in a production rule memory unit with a rule flag indicating a collation failure with any of task data stored in a task data memory unit, the production rule with a set rule flag is inhibited to effect collation until collation of all the other production rules is once effected thereafter, in other words, until one collation round is completed.

Another aspect of the production system for an expert system according to the present invention is to provide a collation success and failure cycle memory unit which stores production rule number of collation success and of collation failure with regard to the respective collation cycle number and thereby to change a predetermined priority assigned to the respective production rules for the next operation in an order of collation success of the production rules during the present operation of the production system, and further optionally to raise a predetermined priority assigned to the respective production rules for the next operation, of which condition parts matched with at least the parts of the task data during the present operation and to lower a predetermined priority assigned to the respective production rules for the next operation, of which condition parts did not match with any of the task data during the present operation of the production system.

BRIEF DESCRIPTION OF THE DRAWINGS

FIG. 5(*a*), 5(*c*), 5(*e*) and 5(*g*) show examples of described production rules, and FIGS. 5(*b*), 5(*d*), 5(*f*) and 5(*h*) illustrate equivalent conversions from one logic circuit to another through executions of the respective production rules shown in FIGS. 5(*a*), 5(*c*), 5(*e*) and 5(*g*);

FIG. 9(*a*), FIG. 9(*b*) and FIG. 9(*c*) show relationships of collation success, collation failure or collation skipping of the respective production rules with respective collation cycles for the respective first, second and third embodiments of the present invention;

FIG. 15(a), 15(b) and 15(c) show relationship of collation success, collation failure or collation skipping of the respective production rules with respective collation cycles for the respective fourth embodiment during the initial operation, fourth embodiment after learning processing and fifth embodiment after learning processing according to the present invention.

PREFERRED EMBODIMENTS OF THE INVENTION

First embodiment

A first embodiment of the present invention will now be explained in conjunction with FIG. 1 which illustrates the block diagram of the first embodiment.

Figure 1:
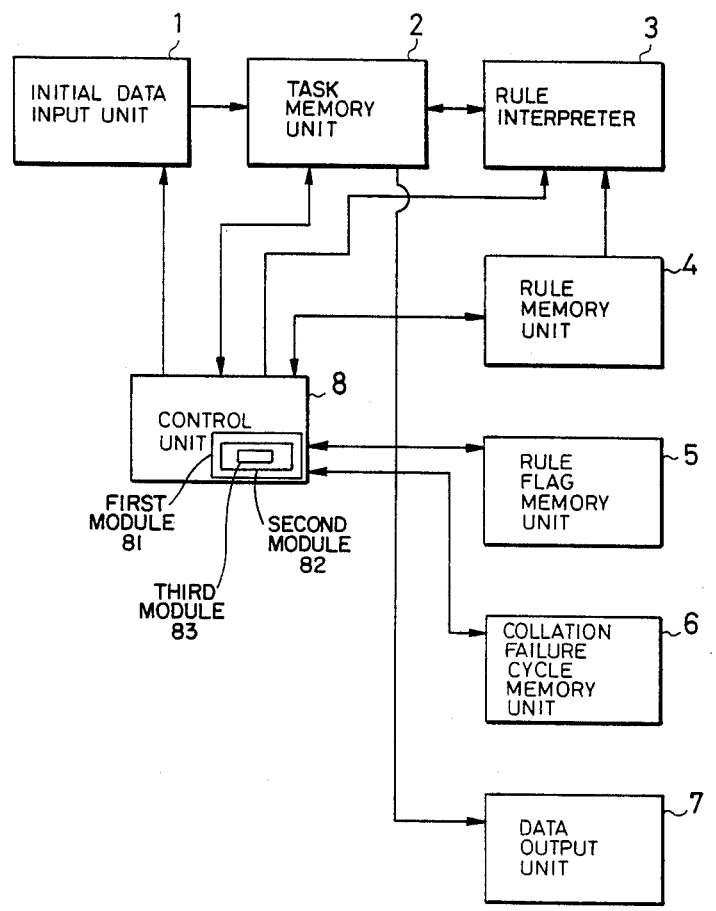
FIG. 1 shows a block diagram of first to third embodiments according to the present invention.

In FIG. 1, reference numeral 1 denotes an initial data input unit for inputting initial circuit connection data, that are to be equivalently converted to a CMOS logic circuit, reference numeral 2 denotes a task memory unit for storing circuit connection data that are to be equivalently converted, reference numeral 3 denotes a rule interpreter which takes out the production rules stored in a rule memory unit 4, which collates the connection data stored in the task memory unit 2 with the condition part of the production rules, and which, when collation is effected, serves as an interpretation and execution unit to execute the execution part of the collated production rule, reference numeral 4 denotes the rule memory unit for storing a plurality of production rule groups for equivalent conversion, reference numeral 5 denotes a memory unit for a rule flag that is set in the production rule that failed to effect the collation, reference numeral 6 denotes a memory element which stores the correspondence between the production rule number that succeed or failed to effect collation in each of the collation cycles and the collation cycle numbers, reference numeral 7 denotes a data output unit which offers the circuit connection data stored in the task memory unit 2 to a user in the form of such as a print and a display, and reference numeral 8 denotes a control unit which controls the whole system.

Figure 2:
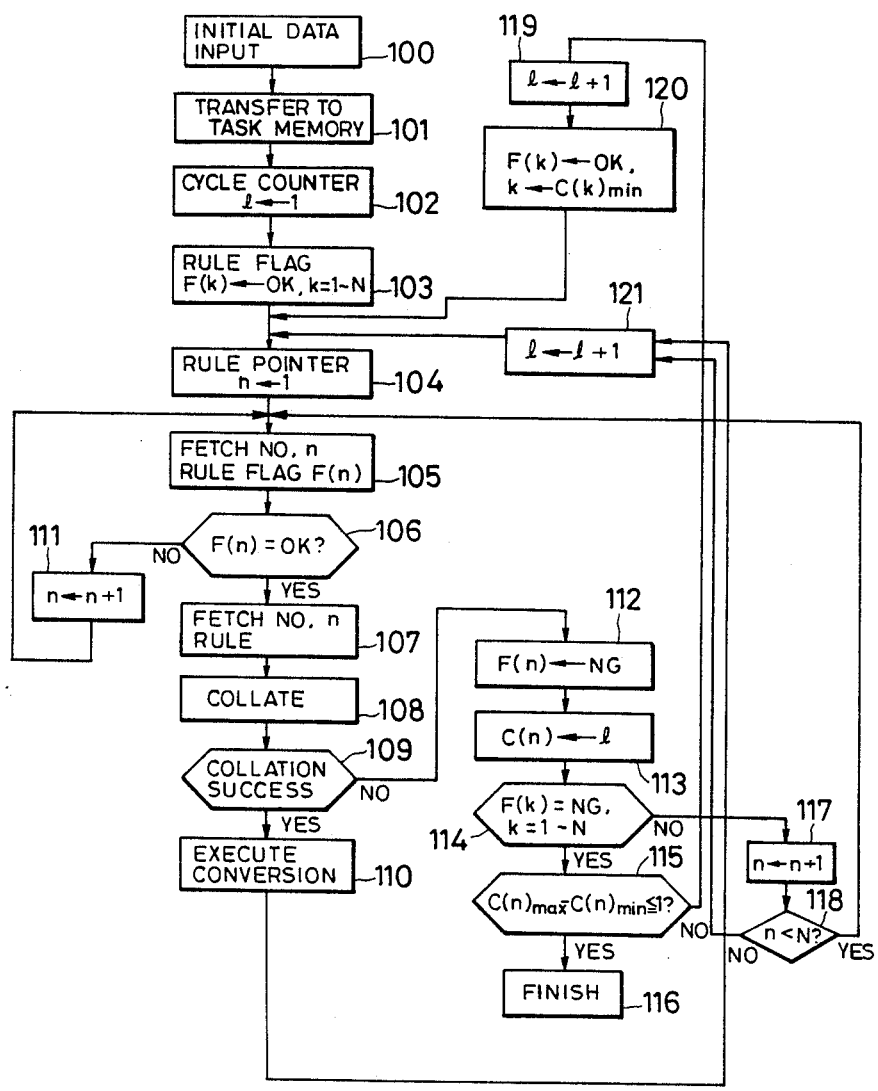
FIG. 2 shows a flow chart illustrating an operation of the first embodiment according to the present invention.

The first embodiment employing a rule flag will now be described in detail in conjunction with a flow diagram of FIG. 2.

Figures 3, 4:
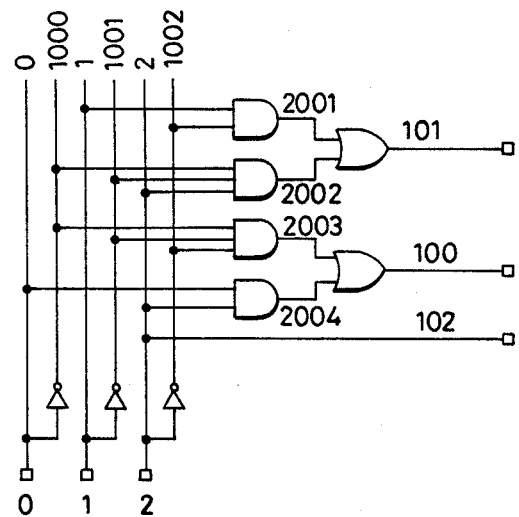
FIG. 3 shows an example of logic circuit to be converted by the embodiments of the present invention.
FIG. 4 shows a net list of the circuit connection illustrated in FIG. 3.

First, it is presumed that the circuit connection data corresponding to a circuit diagram of FIG. 3 are stored in the form shown in FIG. 4 in the initial data input unit 1 of FIG. 1.

In FIG. 4, the first elements, i.e., and, inv, or, etc. of the circuit connection data represent logic types of gates, the second elements represent node number or node name lists of input terminals, and the third elements represent node number or node name lists of output terminals.

In the rule memory unit 4 are stored production rules in the form of "if then" shown in FIGS. 5(a), 5(c), 5(e) and 5(g). After "if", there follows a condition part where interrelations with circuit connection data subject to an equivalent conversion are described in such a form that node data in the list are indicated by variables. The Prolog language is used so that the same node numbers are substituted for the same variables.

After "then", there follows an execution part where a Prolog program is described to renew the contents in the task memory that is executed when the "if" part is successfully collated with the contents in the task memory.

It is now presumed that a plurality of production rules such as shown in FIGS. 5(a), 5(c), 5(e) and 5(g), for example 20 production rules, are arranged in the order of a predetermined priority. The production rule of FIG. 5(a) is a fifth production rule that performs the conversion as shown in FIG. 5(b). FIG. 5(c) illustrates a ninth production rule which performs the conversion shown in FIG. 5(d). FIG. 5(e) illustrates an eleventh production rule which effects the conversion shown in FIG. 5(f). FIG. 5(g) illustrates a seventeenth production rule which effects the conversion shown in FIG. 5(h). There are only four production rules illustrated in FIGS. 5(a), 5(c), 5(e) and 5(g) that are necessary for an equivalent conversion of the circuit of FIG. 3, and other rules, e.g., 16 other production rules, that are not shown are irrelevant ones that all fail to effect collation for the present conversion of the circuit diagram shown in FIG. 3.

Operation of the first embodiment will now be described with reference to the flow chart of FIG. 2.

First, a net list that is to be equivalently converted shown in FIG. 4 is input through an initial data input unit 1 by a step 100 and is transferred through a step 101 by the function of the control unit 8 to the task memory unit 2.

A counter for production rule collation cycle is initially set to 1 through a step 102, and the rule flags are all set to OK through a step 103.

A rule pointer n that indicates the number of the production rule is set to 1 through a step 104. A rule flag F(1) of n=1 is taken out from the rule flag memory 5 through a step 105.

In this case, the rule flag has a value OK and the production rule of n=1 is taken out through steps 106 and 107.

Next, it is attempted to collate the list of the condition part of the production rules with the content in the task memory shown in FIG. 4 through a step 108.

However, since the task memory unit 2 does not contain circuit connection data for collation with the condition part of the production rule 1, the collation results in failure and NG is substituted for the rule flag F(1) through steps 109 to 112.

Next, the present collation cycle number 1 is substituted for C(1) in the collation failure cycle memory through a step 113.

In the present state, OK is stored from F(2) to F(20) of the rule falgs, and hence one is added to the rule pointer to obtain 2 at step 117 through step 114.

This value is smaller than the total number N=20 of the production rules, and the procedure is proceeded to the application of the next production rule through a step 118 to step 105.

In this case, the rule pointer has a value 2, and a rule flag F(2) is taken out through step 105. Since this value is OK, the production rule 2 is taken out through steps 106 and 107 to perform collation which, however, results in failure through steps 108 and 109 and the procedure is branched to step 112.

Thus, as the collation of production rules is repeated successively, the contents in the task memory are not collated with the condition parts of production rules from the production rule 1 through up to the production rule 4; i.e., the collations have all resulted in failure. Therefore, NG is stored in F(1) through up to F(4) of rule flags, and the present collation cycle number 1 is substituted for C(1) to C(4) in the collation failure cycle memory.

As the procedure is branched to step 105, the production rule 5 shown in FIG. 5(a) is taken out. Here, the condition part of the production rule 5, i.e.;

[[and, In 1, Out 1],
[and, In 2, Out 2],
[not_match, In 1, In 2],
[intersect, In 1, In 2, Ans],
[num_of_atom, Ans, N],
[not_match, N, 0],
[not_match, N, 1]], is collated with the circuit connection data list indicated by the underlines in the task memory of FIG. 4

[and, [1000, 1001, 2], 2002] and
[and, [1000, 1001, 1002], 2003], wherein [1000, 1001, 2] is substituted for the variable In 1, 2002 is substituted for Out 1, [1000, 1001, 1002] is substituted for In 2, and 2003 is substituted for Out 2. Therefore, the condition part is rewritten in to a concrete form as follows:

[[and, [1000, 1001, 2], 2002],
[and, [1000, 1001, 1002], 2003],
[not_match, [1000, 1001, 2], [1000, 1001, 1002]],
[intersect, [1000, 1001, 2], [1000,1001, 1002],
[1000, 1001]],
[num_of_atom, [1000, 1001], 2],
[not_match, 2, 0],
[not_match, 2, 1]]

Here, "not_match" is a function for examining whether the two lists are different from each other. The functions not_match contained in the above condition statement all hold true.

On the other hand, "intersect" is a function which finds a common element between the two lists and determines whether it is equal to the third argument. In this case, [1000, 1001] is a common element, and this function "intersect" results in success.

Further, the function "num_of_atom" determines whether the element number in the first argument list is equal to that in the second argument. In this case, the element number of the list [1000, 1001] is 2, and the function holds true.

It is therefore determined that the above condition part all holds true, and the execution part of the production rule is executed to effect the equivalent conversion as shown in FIG. 5(b) through a step 110.

For the present collation Prolog pattern matching function of the rule 5 is used. After the collation is effected successfully, the execution part is executed, the procedure proceeds to step 121, 1 is added to the collation cycle counter, and the next collation cycle 2 is commenced through step 104.

As described above, when it is determined that a given production rule is applicable during a given collation cycle, the production rule is applied only once to renew and rewrite the contents in the task memory unit. Then, the next collation cycle is commenced.

In the collation cycle 2, NG exists from the rule flag 1 through up to the rule flag 4 and, hence, the collation is again effected from the production rule 5.

That is, priority of the rules 1 to 4 are renewed to be low and the priority of the production rule 5 is renewed to be high. Collation is attempted from the production rule 5. However, when the task memory no longer contains the connection data to be collated, the rule flag F(5) is set to NG through steps 108,109, and 112, and the present collation cycle number 2 is substituted into the collation failure cycle memory C(5) through a step 113.

When the collation of the production rule 5 has gone successively again in the collation cycle 2, the collation is attempted again from the production rule 5 in the next collation cycle 3.

Similarly, the procedure proceeds to the collation processing for the next production rule 6 through steps 114, 117, 118 and 105.

Thus, the collation is successively effected for the production rules 6, 7, 8, 9 and 10, which, however, all results in failure. Therefore, the rule flags F(1) to F(10) are all NG, and the present collation cycle number 2 is substituted into the collation failure cycle memories C(6) to C(10).

Next, the production rule 11 is successfully collated, the execution part of the rule is executed and, then, the collation cycle 3 is commenced through step 121.

In one collation cycle as mentioned above, the collation is inhibited for the production rule that was not applied in the previous collation cycles, and the termination of the operation is determined when all rule flags are NG through steps 114 and 115.

The termination is determined under the condition where the difference of collation cycle number is smaller than 1 in the collation failure cycle memories C(1) to C(20) provided for the respective production rules. Here, if the termination condition is satisfied, there does not exist any rule that is to be collated and the operation is terminated through step 116.

When the difference of contents in the collation failure cycle memory is not smaller than 1, it means that the rule collation does not fail uninterruptedly for all of the production rules. Therefore, 1 is added to the cycle counter through a step 119, and the next collation cycle is commenced.

The procedure then proceeds to a step 120 where the value is returned from NG to OK for the rule flags of the production rules that correspond to those having collation cycle numbers other than the greatest collation cycle number in the collation failure cycle memory. The procedure proceeds to step 104 where the collation processing is continued.

FIG. 9(a) shows the manner of collation of the production rules in the collation cycles according to the first embodiment. Here, a mark x represents failure of collation and indicates that the condition part of the production rule to be collated did not hold true even when all of the combination of contents in the task memory of FIG. 4 were treated.

Figure 10A:
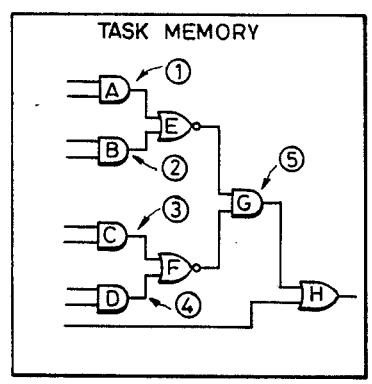
FIG. 10(*a*), 10(*b*) and 10(*c*) are schematic illustration for explaining collation failure in connection with the first embodiment of the present invention.
Figure 10B:
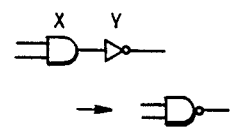
Figure 10C:
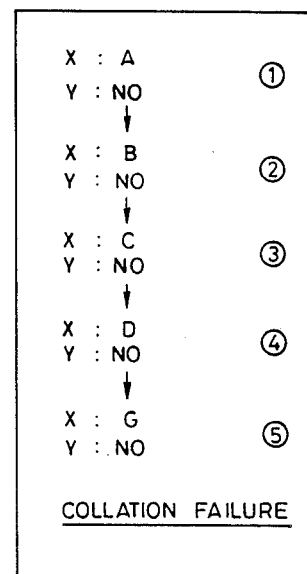

FIG. 10 is a diagram which illustrates the failure of collation in an easily comprehensible manner. Considered below is the case where the condition part of the production rule of FIG. 10(b) is to be collated with the content in the task memory that corresponds to the circuit diagram shown in FIG. 10(a). It is now presumed that the AND gate X is a first condition, and the NOT gate Y is a second condition in the present production rule. The task memory of FIG. 10(a) contains five AND gates that corresponds to the AND gate X. There exists no NOT gate Y. In such a case, it is learned that none of the condition part of the production rule are collated after they are collated five times as shown in FIG. 10(c). It is therefore determined that collation of the production rule has resulted in failure. Therefore, the calculation time required for determining the failure of collation is extended very greatly with the increase in the scale of circuit connection data and with the increase in the degree of complexity of the condition part of the production rule.

The O mark in FIG. 9(a) shows the success of collation which means that the condition part of the production rule is satisfied by a combination of circuit connection data found for the first time in the contents of the task memory, that the execution part of the production rule is applied only once, and that the contents in the task memory are rewritten. The calculation time required for this operation is usually shorter than the time for determining the failure of collation.

Blank in FIG. 9(a) represents unnecessary collation that is omitted or skipped by making reference to the rule flags.

According to this first embodiment, the processing is terminated after a total of nine collation cycles.

Figures 6A, 6B:
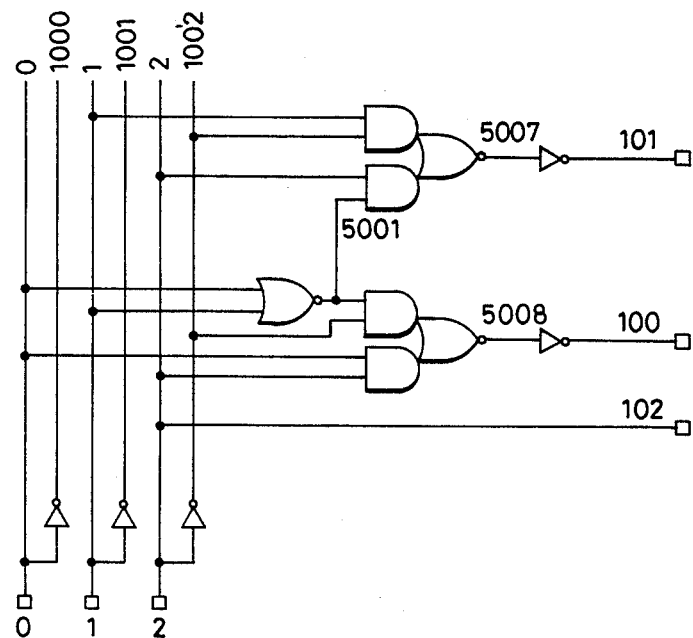
FIG. 6(*a*) shows a converted equivalent logic circuit shown in FIG. 3 through the embodiments of the present invention, FIG. 6(*b*) shows a net list of the circuit connection shown in FIG. 6(*a*) and also a rewritten net list of the circuit connection shown in FIG. 4.

As a result, the content in the task memory shown in FIG. 4 is converted into the one shown in FIG. 6(b) and the corresponding logic diagram becomes as shown in FIG. 6(a).

Second embodiment

Next, a second embodiment of the present invention will be described.

Figures 7, 8:
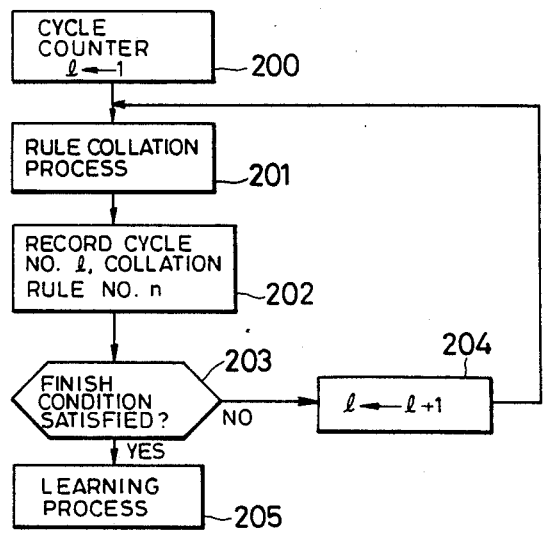
FIG. 7 shows a flow chart illustrating a part of operation of the second embodiment according to the present invention.
FIG. 8 shows a table of cycle predicates used in the second embodiment of the present invention.
Figure 11:
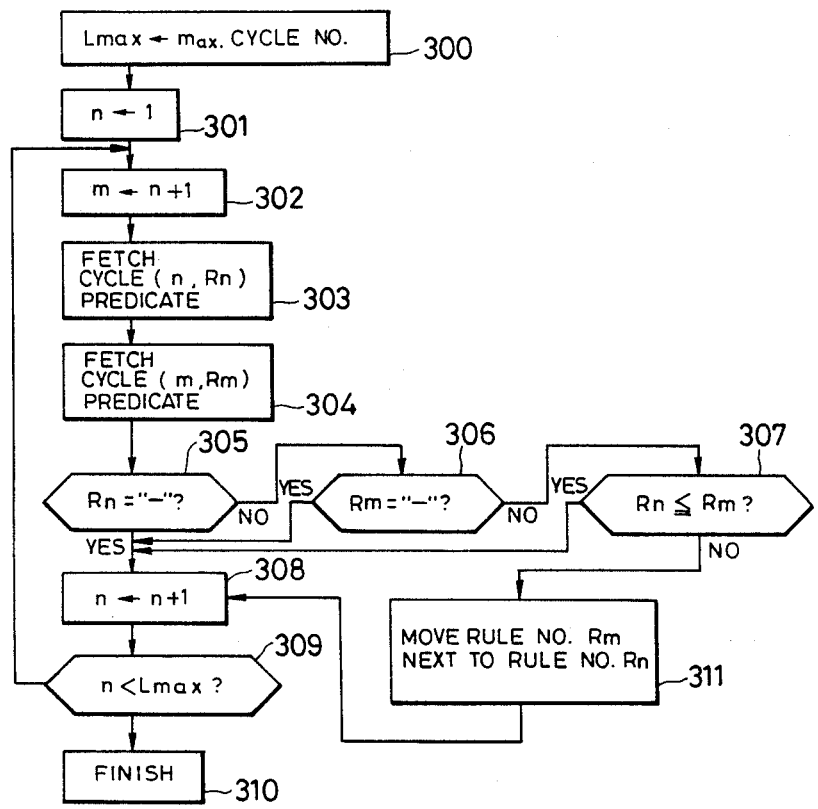
FIG. 11 shows a flow chart illustrating a part of operation of the second embodiment according to the present invention.
Figure 13:
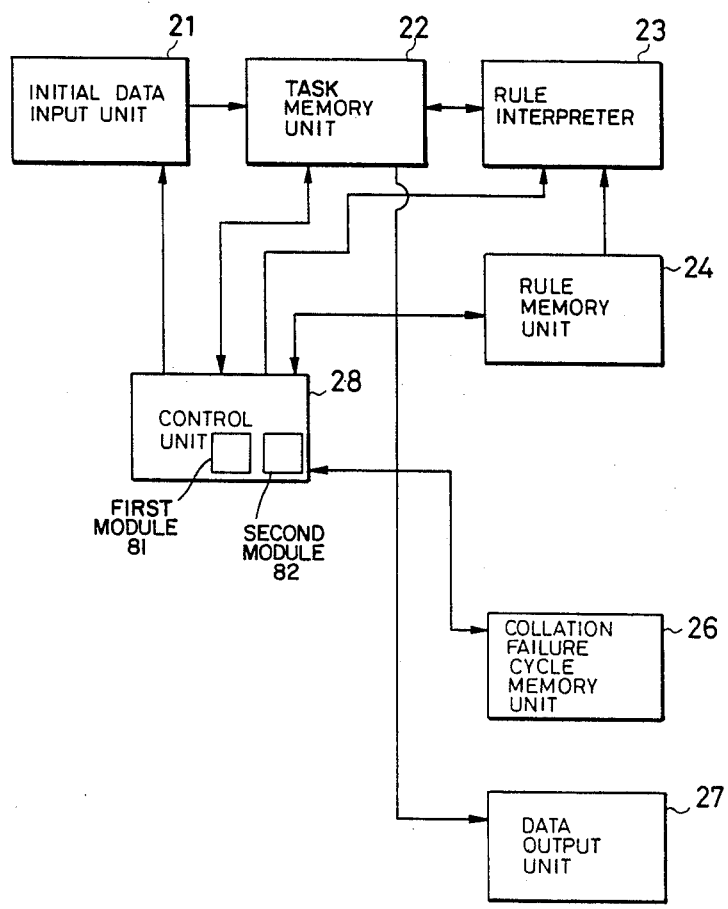
FIG. 13 shows a block diagram of fourth to fifth embodiments according to the present invention.

According to this second embodiment, the process shown in the flow charts of FIGS. 7 and 11 is added to the process explained in connection with the first embodiment and are represented by first, second and third program modules 81, 82 and 83, respectively, shown in FIGS. 1 and 13.

In addition to the processing of the first embodiment, the collation cycle numbers and the numbers of production rules that are successfully collated are recorded in the task memory in a form shown in FIG. 8 through steps 200, 201 of the first program module 81, 202, 203, 204 and 201 shown in FIG. 7.

The collation cycle is repeated as described above. When the termination condition mentioned in the first embodiment is satisfied, the cycle predicates indicating information concerning the collation cycle numbers and the rule numbers collated in the respective collation cycles shown in FIG. 8 are enumerated in the task memory.

The procedure then proceeds to the learning processing through steps 203 to 205 that will be described below.

The learning processing of the second and third program modules 82 and 83, respectively will be described with reference to a flow chart of FIG. 11.

First, the collation cycle number required for the previous equivalent conversion operation is substituted for Lmax at a step 300. In this case, 9 is substituted for Lmax.

Next, 1 is substituted for the variable n through a step 301 and 2 is substituted for the variable m through a step 302.

Then, the production rule numbers Rn and Rm are examined by making reference to the cycle predicates through steps 303 and 304 in which the collation cycle numbers correspond to n and m.

In a step 305, first, whether Rn is an invalid number "-" or not is examined. If Rn is "-", the procedure proceeds to a step 308. If it is not, the procedure proceeds to a step 306 to examine if Rm is an invalid number. If Rm is an invalid number "-", the procedure proceeds to a step 308 and if it is not, the procedure proceeds to a step 307 to compare the magnitude of Rn and Rm. Here, if Rn is smaller than Rm, the procedure proceeds to a step 308 and if it is not, the procedure proceeds to a step 311.

In this second embodiment, since the cycle predicates with regard to the first and second collation cycles are those shown in FIG. 8, in that, the cycle (1, 5) and (2, 11), the procedure proceeds to the step 308 through steps 305, 306 and 307.

In the step 308, 1 is added to the variable n. When the value n is smaller than Lmax, the procedure is branched to step 302 where the learning processing is resumed concerning the next collation cycle.

In comparing the magnitude in step 307, if the production rule number Rn is greater than the production rule number Rm, the order of production rule Rn and production rule Rm is to be reversed which makes it possible to decrease the number of collation cycles. Therefore, the production rule Rm is moved to just after the production rule Rn through a step 311. The procedure then proceeds to a step 308.

The learning processing is terminated when all of the cycle predicates are examined through steps 308, 309 and 310.

In the case of this second embodiment as will be obvious from FIG. 8, the priority order of production rule 17 and production rule 9 is reversed, and the order of production rules is rearranged as shown in FIG. 9(b), one that is underlined is the rearranged rule, whereby it is made possible to decrease the number of collation cycles and the number of collation failure times for the similar problem, in that, nine collation cycles to eight collation cycles.

Third embodiment

A third embodiment of the present invention will now be described.

Figure 12:
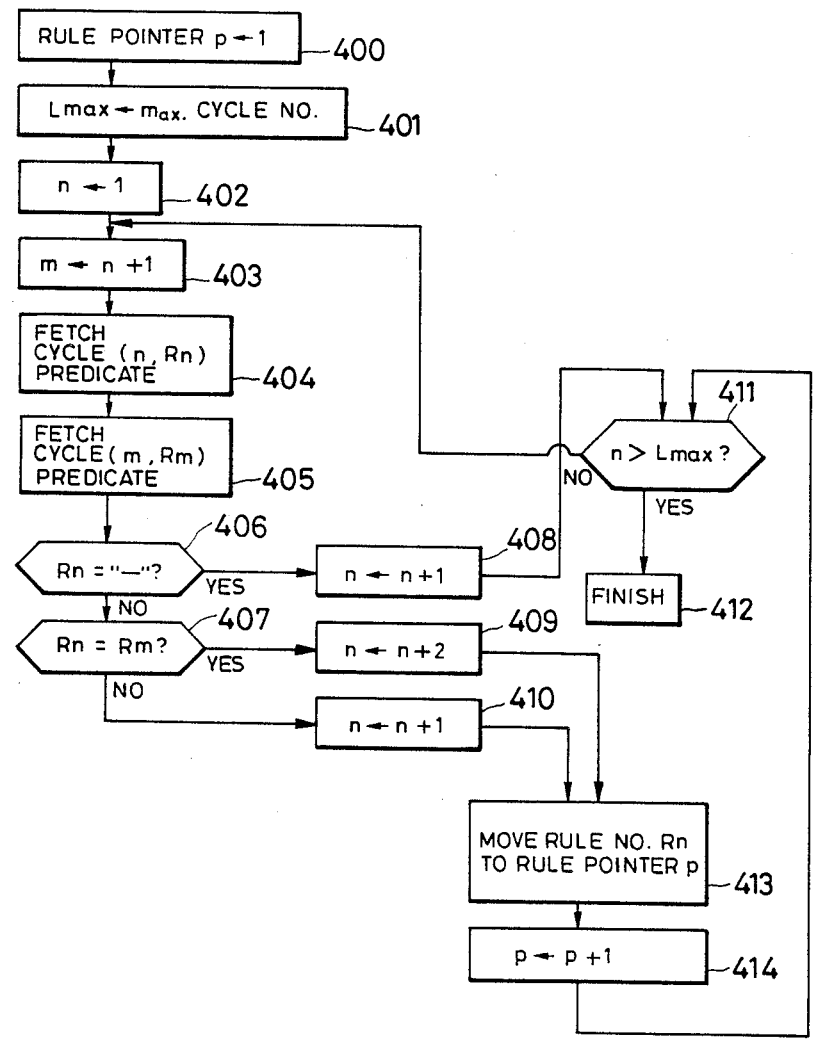
FIG. 12 shows a flow chart illustrating a part of operation of the third embodiment according to the present invention.

In this third embodiment, further rearrangement of the production rule order is effected by the second and third program modules 82 and 83, respectively utilizing the cycle predicates obtained in the second embodiment to increase the processing speed for the problems of the same kind. The flow of this processing will now be explained with reference to a flow chart of FIG. 12.

First, the value of the rule pointer p is initially set to 1 through step 400 to give a position to a production rule after rearrangement.

Next, a maximum cycle number after completing the operation of the second embodiment is substituted for the variable Lmax through step 401. In this embodiment, Lmax has a value 8.

Next, the variable n is initially set to 1 through step 402 and the variable m is initially set to 2 through step 403.

Then, cycle predicates corresponding to the collation cycle numbers n and m are taken out. In this case, the cycle predicates shown in FIG. 8 obtained through the second embodiment are registered in the task memory unit 2. That is, the cycle (1, 5) and cycle (2, 11) are first taken out through steps 404 and 405. Here, $Rn = R_1 = 5$, and the value of $R_1$ is not "-". Therefore, the procedure proceeds from step 406 to step 407 where $R_1$ and $R_2$ are compared with each other.

Here, since $Rm = R_2 = 11$, the procedure proceeds to step 410 where 1 is added to the value n, and the production rule 5 is moved to the position where the rule pointer p has a value 1 through step 413.

Then, 1 is added to the rule pointer p so that it has a value 2, and the procedure proceeds to step 411. Here, since the value n is still smaller than Lmax, the procedure proceeds from step 411 to step 403, and the next loop is resumed.

This processing is repeated so that the production rules are rearranged in the order of production rule numbers that appear in the cycle predicates of FIG. 8, and the production rules are arranged in the head part in the order of 5, 11, 17 and 9.

If a similar equivalent conversion problem is solved using the group of thus rearranged production rules, the number of collation failure times can be further reduced compared with that of the second embodiment as shown in FIG. 9(c).

Fourth embodiment

Figure 14:
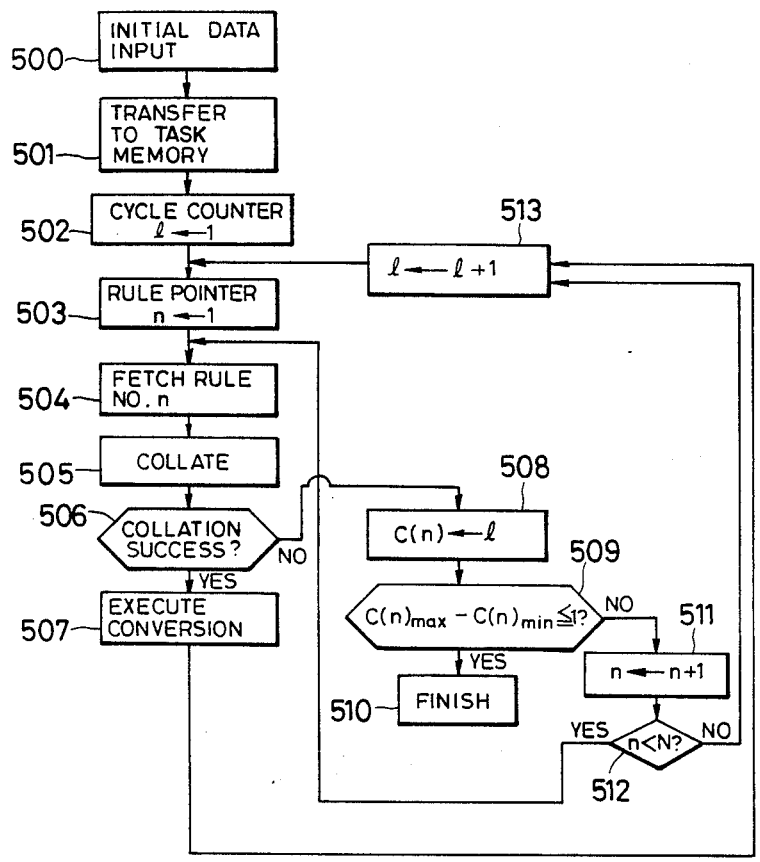
FIG. 14 shows a flow chart illustrating an operation of the fourth embodiment according to the present invention.

A fourth embodiment which eliminates the rule flag for inhibiting the production rule application will be described with reference to FIGS. 13 and 14. In FIG. 13 wherein reference numeral 21 denotes an initial data input unit for inputting the initial data of circuit connection data to be equivalently converted to a CMOS logic circuit, 22 denotes a task memory unit for storing circuit connection data that are to be equivalently converted, 23 denotes a rule interpreter which takes out the production rules stored in a rule memory unit 24, which collates the circuit connection data stored in the task memory unit with the condition parts of the production rules, and which serves as an interpretation and execution unit that executes the execution part of the production rule that is collated, 24 denotes the rule memory unit for storing a group of the equivalent conversion rules, 26 denotes a collation success and failure cycle memory unit which stores the correspondence between the production rule number that succeeded or failed to effect collation in each of the collation cycles and the collation cycle number, 27 denotes a data output unit which displays the circuit connection data stored in the task memory unit to a user, and reference numeral 28 denotes a control unit for controlling the whole system.

The operation of the fourth embodiment will now be described in conjunction with a flow chart of FIG. 14.

It is first presumed that the circuit connection data corresponding to the circuit diagram of FIG. 3 are stored in the initial data input unit 21 in the form that is shown in FIG. 4.

In FIG. 4, the first elements, i.e., and, inv, or, etc. of circuit connection data represent logic types of gates the second elements represent node number or node name lists of input terminals, and the third elements represent node number or node name list, of output terminals.

In the rule memory unit 24 are stored production rules in the form of "if then" shown in FIG. 5. After "if", there are described interrelations with the circuit connection data subject to equivalent conversion in a form where node data in the list are indicated by variables. The Prolog language is used so that the same node numbers are substituted for the same variables.

After "then", there is described a Prolong program to renew the contents in the task memory unit that is executed when the "if" part is successfully collated with the contents in the task memory unit.

It is now presumed that a total of 20 production rules are arranged in the order. Further, there are only four production rules illustrated in FIGS. 5(a), 5(c), 5(e) and 5(g) that are necessary for the equivalent conversion of the connection of FIG. 3, and the other rules are irrelevant ones that all fail to effect collation.

Operation of the fourth embodiment will now be described with reference to the flow chart shown in FIG. 14.

First, a net list that is to be equivalently converted shown in FIG. 4 is input through an initial data input unit 21 by a step 500 and is transferred through a step 501 by the function of the control unit 26 to the task memory unit 22.

A counter of the rule collation cycle is initially set to 1 through a step 502, and the rule pointer n that indicates the production rule number is set to 1 through a step 503.

Next, it is attempted to collate the list of the condition part of the production rule 1 designated by the rule pointer with the content in the task memory shown in FIG. 4 through a step 505.

However, since the task memory does not contain circuit connection data collatable with the condition part of the production rule 1, the collation results in failure and the present collation cycle number 1 is substituted into the collation failure cycle memory C(1) through a step 508.

Next, 1 is added to the rule pointer so that it will have a value 2 at a step 511 through a step 509.

The value of the pointer is smaller than the total production rule number N=20, and the procedure is transferred to the application of the next production rule through steps 512 and 504.

In this case, the rule pointer has a value 2, and the production rule 2 is taken out through step 504. The collation that is attempted also results in failure through step 505 and 506, and the procedure is branched to a step 508.

Thus, as the collation of production rules is repeated successively, the contents in the task memory unit are not collated with the condition parts of the production rules from the production rule 1 through up to the rule 4; i.e., the collations have all resulted in failure. Therefore, the present collation cycle number 1 is substituted into the collation failure cycle memories C(1) to C(4).

As the procedure is branched to step 504 a, the production rule 5 is taken out. Here, the condition part of the rule 5, i.e.;

[[and, In 1, Out 1],
[and, In 2, Out 2],
[not—match, In 1, In 2],
[intersect, In 1, In 2, Ans],
[num—of—atm, Ans, N],
[not—match, N, O],
[not—match, N, 1]], is collated with a circuit connection data list in the task memory unit in the step 505, and is rewritten in a concrete form in the same manner as the first embodiment as follows:

[[and, [1000, 1001, 2], 2002],
[and, [1000, 1001, 1002], 2003],
[not—match, [1000, 1001, 2], [1000, 1001, 1002]],
[intersect, [1000, 1001, 2], [1000, 1001, 1002],
[1000, 1001]],
[num—of—atom, [1000, 1001], 2],
[not—match, 2, 0],
[not—match, 2, 1]], Here, "not—match" is a function for examining whether the two lists are different from each other, and "intersect" is a function which finds a common atom between the two lists and which is introduced into the third argument.

Therefore, it is determined that the above condition part all holds true in the same manner as in the first embodiment, and the execution part of the production rule is executed to effect the equivalent conversion as shown in FIG. 5(b) through a step 507.

The pattern matching function of the Prolog is used for the collation.

The production rule 5 is successfully collated, the execution part is executed, the procedure proceeds to a step 513, and the next collation cycle 2 is resumed through a step 503.

As described above, when it is determined that a given production rule is applicable during a given collation cycle, the rule is applied only once to renew the task memory. Then, the next collation cycle is resumed.

In the collation cycle 2, the collation results in failure from the production rule 1 to the production rule 4 like in the case of the collation cycle 1, and the procedure proceeds to the collation of the production rule 5. However, since the task memory no longer contains the circuit connection data to be collated, collation of the production rule 5 results in failure and the present cycle number 2 is substituted into the collation failure cycle memory C(5) through a step 508.

Similarly, the procedure proceeds to the collation processing for the next production rule through steps 509, 511, 512 and 504.

Thus, the collation is successively effected for the production rules 6, 7, 8, 9 and 10, which, however, all results in failure. Therefore, the present collation cycle number 2 is substituted into the collation failure cycle memories C(6) to C(10).

Next, the production rule 11 is successfully collated, and the collation cycle 3 is resumed through step 513 after the execution part of this production rule is executed.

The above process is repeated, and the termination of operation is determined through step 509, when a collation failure cycle number is stored in all of the collation failure cycle memories.

The termination is determined under the condition where the difference of collation failure cycle number is smaller than 1 in the collation failure cycle memories C(1) to C(20) which are provided for the respective production rules. Here, if the termination condition is satisfied, there does not exist any production rule that can be collated and the process is terminated through a step 510.

When the difference of contents in the collation failure cycle memory is not smaller than 1, it means that the rule collation does not fail uninterruptedly for all of the production rules. Therefore, 1 is added to the cycle counter through a step 513, the next collation cycle is commenced, and the procedure proceeds to a step 503 to continue the collation processing.

Like the second embodiment, the collation cycle numbers and numbers of the production rules that are successfully collated are stored in the task memory in the form as shown in FIG. 8 through steps 200, 201, 202, 203, 204 and 201 of the first program module 81 shown in FIG. 7.

The collation cycle is repeated as described above. When the termination condition mentioned above is satisfied, cycle predicates including information of the collation cycle numbers and the rule number collated in the collation cycles shown in FIG. 8 are enumerated in the task memory. The procedure then proceeds to the learning processing through steps 203 to 205 shown in FIG. 7 that will be described below.

The learning processing of the second and third program modules 82 and 83, respectively will be described with reference to flow chart of FIG. 11 like in the second embodiment.

First, the collation cycle number required for the equivalent conversion processing is substituted for Lmax through a step 300. In this case, 7 is substituted for Lmax. Next, 1 is substituted for the variable n through a step 301 and 2 is substituted for the variable m through a step 302.

Then, the values of production rule numbers Rn and Rm are examined by making reference to cycle predicates through steps 303 and 304 in which the collation cycle numbers correspond to n and m.

In a step 305, first, whether Rn is an invalid number "-" or not is examined. If Rn is "-", the procedure proceeds to a step 308. If it is not, the procedure proceeds to a step 306 to examine if Rm is an invalid number. If Rm is an invalid number "-", the procedure proceeds to a step 308 and if it is not, the procedure proceeds to a step 307 to compare the magnitude of Rn and Rm.

Here, if Rn is smaller than Rm, the procedure proceeds to a step 308 and if it is not, the procedure proceeds to a step 311.

In this fourth embodiment, since the cycle predicates with regard to the first and second are those shown in FIG. 8, in that, the cycle (1, 5) and (2, 11), the procedure proceeds to the step 308 through steps 305, 306 and 307.

In the step 308, 1 is added to the variable n. When the value n is smaller than Lmax, the procedure is branched to a step 302 where the learning processing is resumed concerning the next collation cycle.

In comparing the magnitude in step 307, if Rn is greater than Rm, the order of the production rule Rn and the production rule Rm is to be reversed which makes it possible to decrease the number of collation cycles. Therefore, the production rule Rm is moved to just after the production rule Rn through a step 331. The procedure then proceeds to a step 308.

The learning processing is terminated when all of the cycle predicates are examined through steps 308, 309 and 310.

In the case of this fourth embodiment as will be obvious from FIG. 8, the priority order of production rule 17 and the production rule 9 is reversed, and the order of the production rules is rearranged as shown in Fifth embodiment A fifth embodiment of the present invention will now be described.

In this fifth embodiment, further rearrangement of the production rule order is effected by the second and third program modules 82 and 83, respectively like the third embodiment by utilizing the cycle predicates obtained in the fourth embodiment to increase the processing speed for problems of the same kind. The flow of this processing will now be explained with reference to the flow chart of FIG. 12 in the same manner as in the third embodiment.

First, the value of the rule pointer p is initially set to 1 through step 400 to give such a position to a production rule after rearrangement through a step 400.

Next, a maximum cycle number after completing the operation of fourth embodiment is substituted for the variable Lmax through a step 401. In this fifth embodiment, Lmax has a value 7.

Next, the variable n is initially set to 1 through a step 402 and the variable m is initially set to 2 through a step 403.

Then, cycle predicates corresponding to the collation cycle number n and m are taken out in which the. In this case, the cycle predicates shown in FIG. 8 obtained in the fourth embodiment are registered in the task memory unit 22.

That is, the cycle (1, 5) and cycle (2, 11) are first taken out through steps 404 and 405. Here, $R_n = R_1 = 5$, and the value of $R_1$ is not "-". Therefore, the procedure proceeds from a step 406 to a step 407 where $R_1$ and $R_2$ are compared with each other.

Here, since $R_m = R_2 = 11$, the procedure proceeds to a step 410 where 1 is added to the value n, and the production rule 5 is moved to the position where the rule pointer p has a value 1 through a step 413.

Then, 1 is added to the rule pointer p so that it has a value 2, and the procedure proceeds to a step 411. Here, since the value p is still smaller than Lmax, the procedure proceeds from steps 411 to 403, and the next loop is resumed.

This processing is repeated so that the production rules are rearranged in the order of production rule numbers that appear in the cycle predicates of FIG. 8, and the production rules are arranged in the head part in the order of 5, 11, 17 and 9 as shown in FIG. 15(c).

If a similar equivalent conversion problem is solved using the group of thus rearranged production rules, the number of collation failure time is further reduced, in that, 82 times to 31 times, compared with that of the fourth embodiment.

In the first to fifth embodiments of the present invention, the data concerning the renewed priority of the production rules may be displayed on the data output unit 7 or 27. In this case, the user learns that the priorities of the production rules are renewed and finds it convenient to use.

Figure 16:
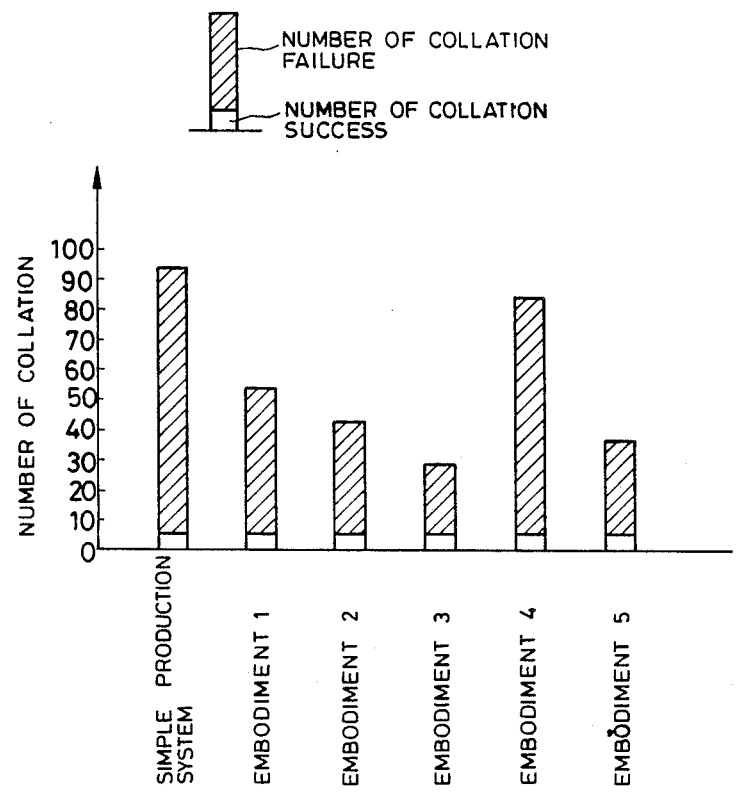
FIG. 16 shows a graph illustrating collation time decreasing effect of the present invention in comparison with the conventional production system.

FIG. 16 shows the comparison of number of collation time among the cases of the embodiments 1, 2, 3, 4, 5 and of a simple production system without any contrivance. Here, the comparison is based on the sum of the collation success time and the collation failure time.

The time for calculating the failure collation is usually longer than the time for calculating the success collation, and the whole processing time is dependent upon number of collation failure. Here, the comparison is simply based upon the sum of the collation successes and the collation failures.

The first embodiment features in speed which is about 1.7 times faster than that of the simple production system, the second embodiment features in speed of about 2.4 times faster than that of the simple production system, the third embodiment features in speed of about 3.6 times faster than that of the simple production system, the fourth embodiment features in speed of about 1.1 times faster than that of the simple production system, and the fifth embodiment features in speed which is about 2.5 times faster than that of the simple production system.

As will be obvious from FIGS. 9(a), 9(b) and 9(c), when the rule flags for inhibiting the application of production rules of the present invention is used under the condition where there exists a plurality of patterns having a similar circuit structure and where the same production rules are repetitively applied in step of conversion, the number of times for collation is increased only by the number of times of repetition, in that, number of collation cycle. On the other hand, in the simple production system, however, the collation must be effected in a number of times which is proportional to the total number of rules x number of repetition. When the scale of the circuit to be handled is greater than that, therefore, the present invention exhibits distinguished effects.

In the case of the circuit having a scale of about 50 gates, in practice, the second embodiment performs the operation at a speed faster than that of the simple production system in an order of about one digit.

According to the present invention, the time for processing the pattern collation is shortened, and there is obtained a high-speed production system for an expert system.

We claim:

1. A production system for an expert system comprising;
    a production rule memory unit for storing a plurality of production rules, each having a condition part and an execution part and a provisionally predetermined priority;
    a task data memory unit for storing a plurality of task data, each being subjected to an application of the production rules;
    a production rule interpretation and execution unit for selecting a production rule in accordance with the provisionally predetermined priority, collating the condition part of the selected production rule with the task data to determine whether the condition part matches with at least a part of the task data and, when both match each other, renewing the part of the task data by the corresponding execution part of the production rule, wherein one collation cycle of said production rule interpretation and execution unit finishes when a collation success is effected and a next collation cycle thereof starts thereafter;
    each production rule being further provided with a rule flag indicating a collation failure to the task data; and
    a rule flag memory unit for setting the rule flag of a production rule when a condition part thereof did not match any of the task data during the collation cycle to inhibit further collation thereafter until collation of all the other production rules is once completed.

2. A production system for an expert system according to claim 1 further comprising:
    a collation success and failure cycle memory unit for storing the results of the collation in terms of collation cycle number and production rule number; and
    first means for changing the priority, for the next operation, of production rules having condition parts matched with at least parts of the task data, in the order of the collation matching in accordance with the stored results in said collation success and failure cycle memory unit.

3. A production system for an expert system according to claim 2 further comprising:
    second means for raising the priority, for the next operation, of production rules having condition parts matched with at least parts of the task data and for lowering the priority, for the next operation, of production rules having condition parts that do not match any of the task data, in accordance with the stored results in said collation success and failure cycle memory unit.

4. A production system for an expert system according to claim 2 further comprising:
   third means for indicating a renewed priority of the production rules in response to changing by said first means.

5. A production system for an expert system according to claim 3 further comprising:
   third means for indicating a renewed priority of the production rules in response to raising and lowering by said second means.

6. A production system for an expert system comprising:
   a production rule memory unit for storing a plurality of production rules, each having a condition part and an execution part and a provisionally predetermined priority;
   a task data memory unit for storing a plurality of task data, each being subjected to an application of the production rules;
   a production rule interpretation and execution unit for selecting a production rule in accordance with the provisionally predetermined priority, collating the condition part of the selected production rule with the task data to determined whether the condition part matches with at least a part of the task data and, when both match each other, renewing at least the part of the task data by the corresponding execution part of the production rule, wherein one collation cycle of said production rule interpretation and execution unit finishes when a collation success is effected and a next collation cycle thereof starts thereafter;
   a collation success and failure cycle memory unit for storing the results of the collation in terms of collation cycle number and production rule number; and
   first means for changing the priority, for the next operation, of production rules having condition parts matched with at least parts of the task data, in the order of the collation matching in accordance with the stored results in said collation success and failure cycle memory unit.

7. A production system for an expert system according to claim 6 wherein said first means moves a production rule which effected collation failure at a first collation round and moves a production rule which effected collation success at a second collation round to a point immediately after a production rule which last effected collation success at the first collation round.

8. A production system for an expert system according to claim 6 further comprising:

second means for raising the priority, for the next operation, of production rules having condition parts matched with at least a part of the task data, and for lowering the priority, for the next operation, of production rules having condition parts that do not match with any of the task data in accordance with the stored results in said collation success and failure cycle memory unit.

9. A production system for an expert system comprising:
   a production rule memory unit for storing a group of circuit conversion rules, each having a condition part describing circuit connection and an execution part describing a conversion of the condition part to an equivalent logic circuit dependent upon a predetermined semiconductor technology and further having a provisionally predetermined priority;
   a task data memory unit for storing a group of circuit connection data, each being subjected to an application of the circuit conversion rules;
   a production rule interpretation and execution unit for selecting a circuit conversion rule in accordance with the provisionally predetermined priority, collating the condition part of the selected circuit conversion rule with the circuit connection data to determine whether the condition part matches with at least a part of the circuit connection data and, when both match each other, converting the part of the circuit connection data by the corresponding execution part of the circuit conversion rule, wherein one collation cycle finishes when a collation success is effected and a next collation cycle starts thereafter;
   each circuit conversion rule further being provided with a rule flag indicating the collation failure to the circuit connection data,
   a rule flag memory unit for setting the rule flag of the circuit conversion rule, having condition part that did not match with any of the circuit connection data during the collation cycle, to inhibit collation thereafter until collation of all other circuit conversion rules is once completed;
   a collation success and failure cycle memory unit for storing the results of the collation in terms of collation cycle number and circuit conversion rule number; and
   a first means for changing the provisionally predetermined priority, for the next operation, of the circuit conversion rule having condition part matched with at least parts of the circuit connection data, in the order of collation matching in accordance with the stored results in said collation success and failure cycle memory unit.

* * * * *